(12) United States Patent
Flentge et al.

(10) Patent No.: US 7,535,333 B2
(45) Date of Patent: May 19, 2009

(54) METHOD FOR MONITORING THE CONTACT RESISTANCE OF A WIPER

(75) Inventors: Stefan Flentge, Raunheim (DE); Fausto Crespo Vidal, Langenselbold (DE)

(73) Assignee: Samson AG, Frankfurt, Am Main (DE)

( * ) Notice: Subject to any disclaimer, the term of this patent is extended or adjusted under 35 U.S.C. 154(b) by 472 days.

(21) Appl. No.: 11/185,268

(22) Filed: Jul. 20, 2005

(65) Prior Publication Data

US 2006/0119466 A1    Jun. 8, 2006

(30) Foreign Application Priority Data

Jul. 23, 2004    (DE)    ........................ 10 2004 035 945

(51) Int. Cl.
*H01L 31/08*    (2006.01)
(52) U.S. Cl. ........................... 338/15; 338/176; 73/305; 29/595; 324/74
(58) Field of Classification Search .................... 338/15, 338/176, 202, 260; 73/1 R, 305, 306, 308; 29/595, 610.1, 610.2, 611, 622; 324/74, 324/601, 664, 667
See application file for complete search history.

(56) References Cited

U.S. PATENT DOCUMENTS

| | | | | |
|---|---|---|---|---|
| 4,992,671 A | * | 2/1991 | Gille et al. ................. | 307/10.1 |
| 5,056,049 A | * | 10/1991 | O'Neill ........................ | 702/55 |
| 5,210,500 A | * | 5/1993 | Pingel et al. ................. | 324/667 |
| 5,805,146 A | * | 9/1998 | Jaeger et al. ................. | 345/172 |
| 5,940,106 A | * | 8/1999 | Walker ........................ | 347/104 |

FOREIGN PATENT DOCUMENTS

| | | |
|---|---|---|
| DE | 35 22 775 C2 | 6/1985 |
| DE | 38 26 937 A1 | 8/1988 |
| DE | 40 20 106 C2 | 6/1990 |
| DE | 196 42 174 A1 | 10/1996 |
| DE | 197 28 596 C2 | 7/1997 |
| DE | 197 51 556 C1 | 11/1997 |
| DE | 198 33 413 C2 | 7/1998 |

* cited by examiner

*Primary Examiner*—Kyung Lee
(74) *Attorney, Agent, or Firm*—Woodling, Krost and Rust (57) ABSTRACT

A method for monitoring a the contact resistance ($R_s$) of the wiper of a sensor for a variable quantity, with a potentiometer (2), in which the position of the center tap (3) determines the value of the quantity, is improved in such a way that, first, when the sensor is used in an automatic control circuit, no control deviations occur and, second, the contact resistance of the wiper can be monitored with precision. This is achieved by the cyclic switching-on of a load ($R_{Last}$), so that the contact resistance ($R_s$) of the wiper can be determined on the basis of the change in the voltage divider ratio.

18 Claims, 6 Drawing Sheets

METHOD FOR MONITORING THE CONTACT RESISTANCE OF A WIPER

The invention pertains to a method for monitoring the contact resistance of a wiper according to the introductory clause of claim 1.

In the case of positioners which have a primary detecting element comprising a potentiometer and a center tap in the potentiometer, malfunctions can occur when the contact resistance of the wiper on the center tap increases. An increase in the contact resistance can be caused by the wear on one of the potentiometer tracks, by chemical contamination of the air or of the potentiometer track, and/or by corrosion of the wiper on the central tap.

Positioners are known which monitor the contact resistance of the wiper. This monitoring, however, consists only in that the wiper signal is checked for interruptions. A circuit of this type leads to a control deviation when the contact resistance of the wiper increases.

A sensor for a variable quantity is known from DE 40 00 521 A1. This sensor comprises a potentiometer with a center tap which determines the quantity. To prevent the malfunctions caused by the contact resistance in the potentiometer, a feed voltage is applied to the center tap, and additional components are provided at the terminals of the potentiometer. Evaluating the electrical values of these additional components makes it possible to determine the position of the center tap. The additional components consist of two additional resistors, one of which is connected in series with ground at the end of each potentiometer track. The sensor with these additional components has the advantage that the position of the wiper of the center tap of the potentiometer can be determined independently of any interfering contact resistance which might be present between the wiper and the resistance track of the potentiometer.

No information, however, can be obtained concerning the status of the center tap. Thus for example, these additional components cannot provide any information on how much wear has occurred, and they thus cannot offer any idea of how long the potentiometer can be expected to operate properly. Nor is it possible with their help to detect chemical impurities in the air or in the potentiometer track and/or corrosion of the wiper of the center tap.

A process for reading values out of at least one potentiometric sensor designed as a voltage divider is known from DE 198 33 413 C2, in which a resistor R2, a circuit element T, a test voltage, and a microcontroller are used. The potentiometer is recognized as defective when a voltage at the wiper terminal falls below a threshold value.

A diagnostic circuit for potentiometric sensors, furthermore, is known from DE 197 51 556 C1. Here an amplitude modulation/demodulation means is used to detect an increase in the contact resistance without interfering with the output signal of the sensor. The diagnosis, however, is able to detect only one defect.

DE 197 28 596 C2 discloses a method for monitoring a potentiometer, in which a feed voltage is scanned periodically and compared with a predetermined limit value. If the feed voltage falls below the limit value, the feed voltage is turned off.

DE 40 20 106 C2 discloses a method for evaluating a potentiometer and detecting failure. A separate circuit (a reference voltage and a pull-up resistor) is used in this case.

DE 35 22 775 C2 discloses a method for determining the approximate contact resistance of the wiper of a potentiometer by means of a voltage divider and a test resistor $R_T$, where a voltage difference $\Delta U$ and a microprocessor are used to determine the contact resistance. When the contact resistance thus determined exceeds a preset value, the evaluation unit produces only one signal, which indicates that the measurement voltage is no longer correct as a result of the wiper contact resistance $R_s$ at the wiper and therefore that the measurement value has been rendered false.

DE 38 26 937 A1, which represents the device of the general type in question, describes a series circuit consisting of a resistor and a transistor. As a result of the addition of the resistor to the circuit, the wiper of the potentiometer is subjected to a short-term load, which causes the voltage to drop. A program running on a microcomputer can then be used to determine the contact resistance of the wiper on the basis of two measurements, i.e., the measurement made under load and the measurement made without the load added by R21. The wiper contact resistance is also compared here with a preset value so that a warning lamp, for example, can be activated.

DE 196 42 174 A1 discloses a circuit which takes advantage of the voltage drop caused by the addition to the circuit of a series resistor RV1. The voltage drop is detected by an A/D converter ADW 2 or by a microcontroller. This circuit arrangement detects only a short-circuit or shunt of a potentiometer wiper terminal. The evaluation unit initiates only a corresponding reaction, such as the output of a warning or diagnostic signal or the execution of an emergency operating program.

The invention is therefore based on the task of improving a method according to the introductory clause of claim 1 in such a way that no control deviations occur in an automatic control circuit.

This task is accomplished by the characterizing features of claim 1 in conjunction with the characteristics of the introductory clause.

The subclaims present advantageous elaborations of the invention.

By means of the method, it is possible not only to monitor the wiper contact resistance with precision—where the wear of the potentiometer track, chemical impurities in the air or in the potentiometer track, and/or corrosion of the wiper of the center tap are monitored—but also, in addition to simply generating an error message, to correct any control deviation automatically.

According to the invention, the change in the ratio of the voltage divider is evaluated by the microprocessor on the basis of the voltage difference resulting from the addition of a load to the circuit. The microprocessor can calculate the exact position of the center tap of the potentiometer and according to the invention makes a corrected value available to the control circuit. Control deviations caused by an increase in the contact resistance of the wiper can thus be completely eliminated.

It is now possible easily and in an advantageous manner to avoid control deviations, i.e., to avoid values which have been falsified by an increase in the contact resistance, which creates a false impression of the actual position of the center tap.

A load is added to the circuit in cycles so that the wiper contact resistance can be determined on the basis of the change in the ratio of the voltage divider. As a result of the measure according to the invention, it is possible not only to monitor the wiper for interruptions in its contact but also to determine the exact value of the wiper contact resistance. From this, it is possible to draw conclusions concerning the amount of wear of the potentiometer track, chemical impurities in the air or potentiometer track, and/or the corrosion on the wiper of the center tap.

In addition, it is possible easily and in an advantageous manner to avoid control deviations, i.e., to avoid falsified values caused by an increase in the contact resistance.

The invention is based on the insight that it is possible to calculate the resistance of the wiper contact by using the principle of adding load to a voltage divider. When additional load is applied to a voltage divider, especially when a load resistor is connected to it, the partial voltage on the loaded side drops. According to the invention, therefore, a switch element in an analog circuit (analog switch) is used to connect the load resistor in a cyclical manner to the voltage divider, whereupon the voltage at the wiper is measured It is then possible to calculate the contact resistance of the wiper from this measurement value, from the load resistance, and from the position of the wiper.

In contrast to the state of the art, which has the goal of minimizing or of completely eliminating the effect of the wiper's contact resistance on a sensor signal (compare DE 40 00 521), here an intentional increase in the wiper contact resistance is used so that, for example, the degree of wear of the wiper contact can be calculated.

The known methods do not make it possible to obtain any information on the wear of the potentiometer track or of the conductive plastic. The inventive method, however, is able to do this.

This principle basically also works for alternating voltages. An inductive or capacitative load is therefore possible. Preferably, however, the load is an ohmic load, especially in the form of a load resistance component.

The publications cited above also fail to give any indication that the microprocessor is intended to provide a corrected actual value for the potentiometer position and to make this corrected actual value available to the control circuit. The state of the art teaches the expert only how to transmit an error message, not how to use a microprocessor to correct a control deviation.

In accordance with an advantageous embodiment of the inventive method, the load is connected between the center tap and ground, that is, zero volts. This simplifies the calculation. It is also possible, however, for the load to be connected to a different voltage.

If the analog voltage at the center tap is converted by an A/D converter to a digital signal, the wiper contact resistance can be calculated advantageously by means a digital computer, especially by a microprocessor. Microprocessors are relatively inexpensive and compact today. The digital components, i.e., the components of the electronic evaluation circuit, can be easily integrated into the analog sensor.

By providing at least one op-amp circuit between the A/D converter and the center tap, the subsequent analog-digital conversion will exert only a negligible effect on the divider ratio. This is a very high-resistance circuit.

The change in the ratio of the voltage divider is advisably evaluated by an evaluation and/or correction means, especially by the microprocessor, on the basis of the voltage difference caused by the addition of the extra load. The microprocessor can then calculate the exact position of the center tap of the potentiometer and make a corrected value available to the control circuit. Control deviations caused by an increase in the wiper contact resistance can thus be completely eliminated.

In another preferred embodiment of the invention, a compensation circuit can be used to compensate for the case in which the center tap is at the zero point, so that monitoring is always possible no matter where the potentiometer is, even if it is at the zero point or close to the zero point.

A first advantageous variant of the compensation measure consists in reversing the polarity of the potentiometer when the center tap is close to the zero point, i.e., the point at which there is no voltage difference or at most only a small voltage difference as a result of the addition of the extra load. Reversing the polarity makes it possible to avoid the zero point in all cases. The reversal can be easily accomplished with the use of appropriate electronic circuit components and can be easily taken into account by the microprocessor.

A second favorable variant of the compensation measure is achieved by connecting the potentiometer between a first voltage potential and a second voltage potential and by connecting the load to a third potential, where the third voltage potential is not between the first and the second potential.

According to a third advantageous variant of the compensation measure, an additional resistor is connected between ground and a potentiometer terminal to raise the voltage signal. Raising the signal ensures that, when the wiper is in the zero position, a voltage will always be present at the corresponding terminal of the potentiometer track. This variant represents a special case.

Additional advantageous elaborations of the invention are characterized in the subclaims.

Figure 1:
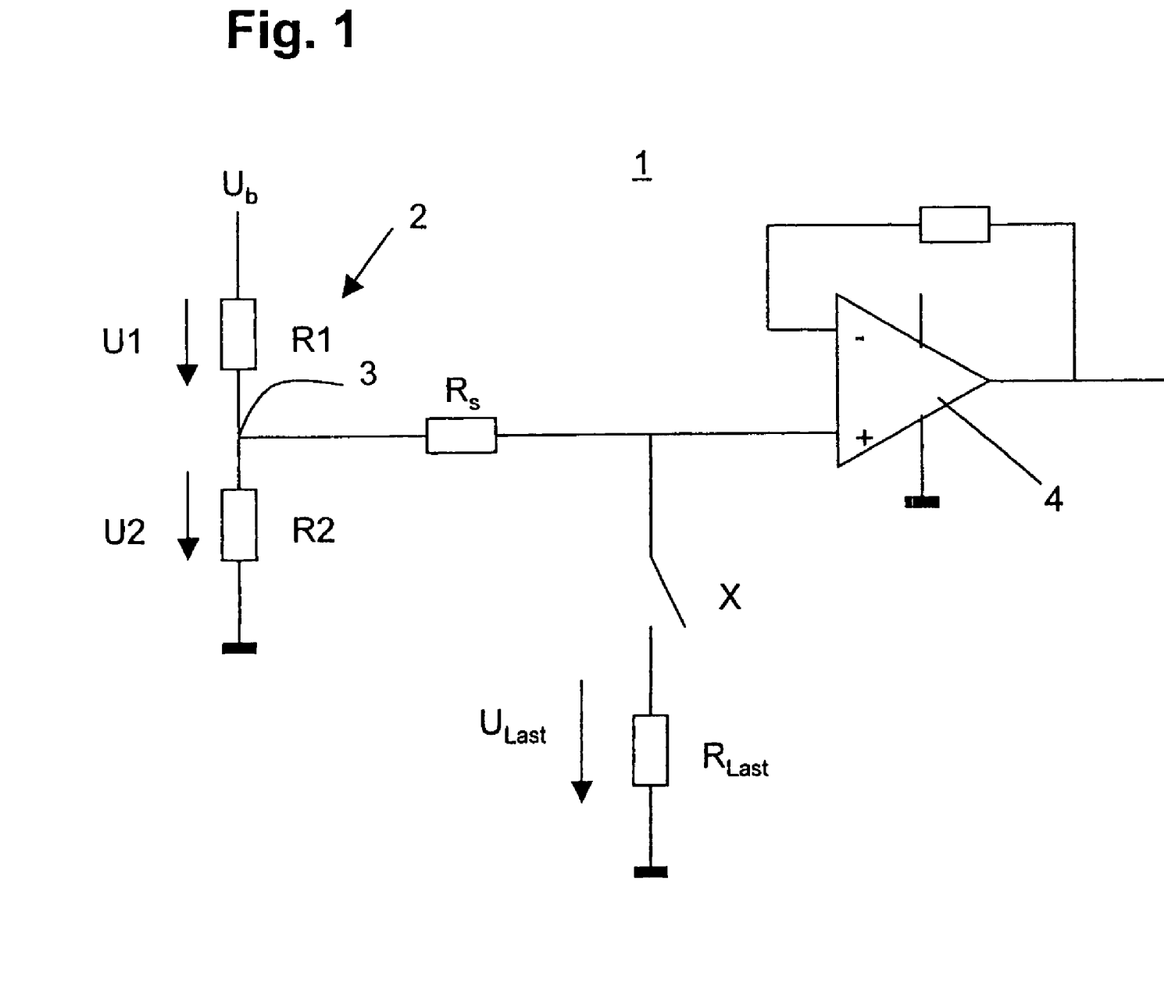
FIG. 1 shows a circuit diagram which can be used to implement the inventive method, where R1 and R2 together form a potentiometer, and where $R_s$ stands for the resistance of the wiper contact to be monitored.

The invention and additional advantages thereof are explained in greater detail on the basis of the description of the figures:

FIG. 1 illustrates an example of a circuit arrangement 1 for implement the inventive method.

This circuit is used in a sensor. The sensor has a potentiometer 2 with a potentiometer resistance R and a potentiometer track, which has a fixed resistance value. A center tap 3 can be rotated or slid to adjust the resistance. Therefore, the potentiometer 3 in this example has a first variable resistor R1, which is connected between a reference voltage $U_b$ and the center tap 3. A second variable resistor R2 is also provided; it is connected between ground and the center tap 3. The series connection of the first and second resistors R1, R2 results in the total resistance R, defined by the resistance track or piece of electrically conducting plastic.

A wiper contact resistance $R_s$ is therefore present at a wiper contact between the center tap 2 and the resistance track.

A variable quantity, such as the "raise" signal of a positioner, can be detected by the sensor. The position of the center tap 3 therefore determines the value of the quantity.

The sensor is preferably used in a control circuit, in which the position of the center tap determines an adjustable nominal value.

The method described below is used to monitor the wiper contact resistance $R_s$ of the sensor, where the position of the center tap determines the value of the quantity.

The wiper contact resistance $R_s$ to be monitored is present at the contact point.

According to the invention, a load or a resistance $R_{Last}$ is switched on in cycles so that the wiper contact resistance $R_a$ can be determined on the basis of the change in the voltage divider ratio.

Therefore, a switch element X is placed between the load $R_{Last}$ and the center tap 3. The wiper contact resistance $R_s$ is located between the center tap 3 and the switch element X. It would also be possible for the switch element X to be connected in parallel to the load resistance $R_{Last}$, which would then in effect be short-circuited.

When the switch is closed, $R_{Last}$ and $R_s$ are connected in series. This series connection is parallel to R2, so that the reference voltage $U_b$ is divided between R1 and the resistance network made up of R2, $R_{Last}$, and $R_s$.

The voltage $U_{Last}$, which is a function of the potentiometer's position q (ranging from 0 to 1), is therefore:

$$U_{Last}(R_s, q) := U_b \cdot \frac{\frac{q \cdot R \cdot (R_s + R_{Last})}{q \cdot R + R_s + R_{Last}}}{(1-q) \cdot R + \frac{q \cdot R \cdot (R_s + R_{Last})}{q \cdot R + R_s + R_{Last}}} \cdot \frac{R_{Last}}{R_{Last} + R_s}$$

where the relationships R1=(1−q)R and R2=qR are used.

For example, let R=20 kΩ, $R_s$=20 kΩ, $R_{Last}$=200 kΩ, q=0.5, $U_{b=3.3}$ V, and the voltage $U_{Last}$=1.467 V.

The load current $$I_{Last}(R_s, q) := \frac{U_{Last}(R_s, q)}{R_{Last}}$$

is therefore 7.333 μA.

When the switch element X is open, the voltage $U_2$=1.65 V is present, which is calculated by means of the equation:

$$U_2(q) := U_b \cdot \frac{q \cdot R}{(1-q) \cdot R + q \cdot R}$$

There is therefore a voltage difference between the turned-on state and the turned-off state.

Figure 2:
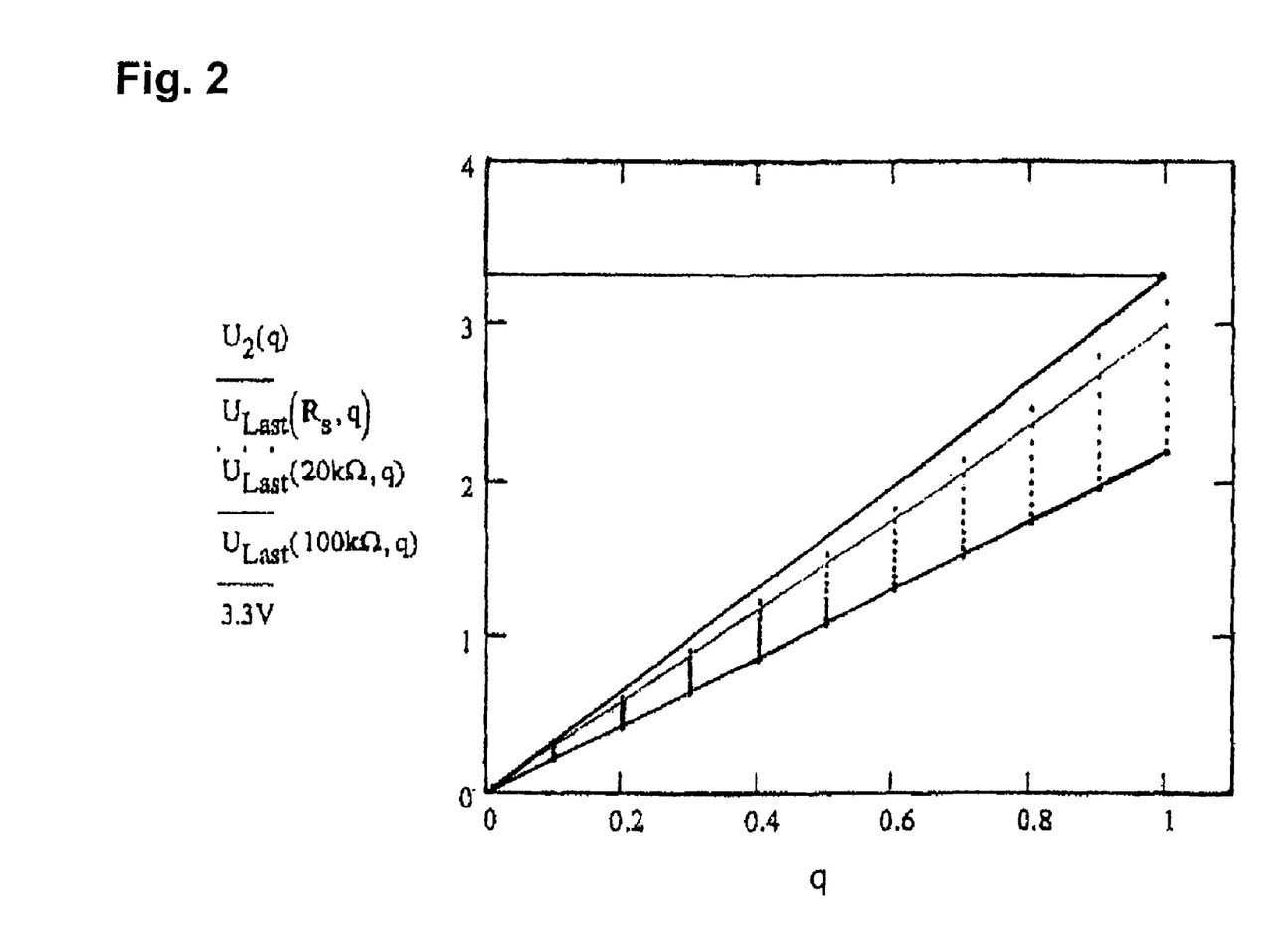
FIG. 2 shows a graph of a partial voltage as a function of the switching state of a switch element which switches on a load and also as a function of the position of the center tap of a potentiometer.
Figure 3:
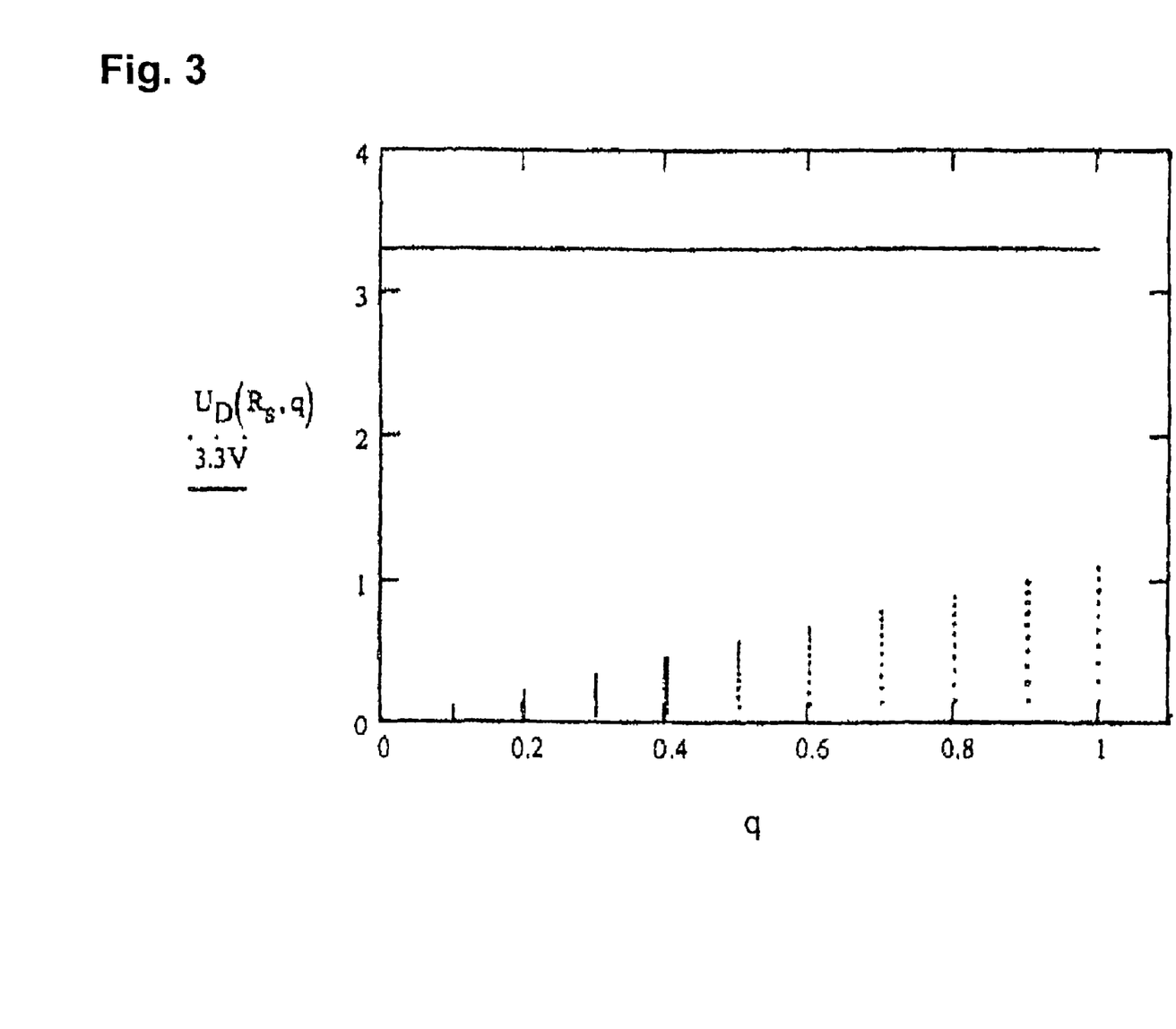
FIG. 3 shows a graph of the voltage differences between a turned-on and a turned-off state as a function of the position of the center tap of the potentiometer, where the vertical lines represent the dependence of the wiper contact resistance.

FIG. 2 shows the voltages $U_{Last}$ (for 20 kΩ and 100 kΩ) and $U_2$ as a function of the potentiometer's position. The changes in $U_{Last}$ as a function of $R_s$ (of 10 kΩ and 100 kΩ) and of the potentiometer's position q (from 0 to 1) are shown in dotted line. This is also illustrated in FIG. 3.

By rearranging the first equation ($U_{Last}$(Rs, g)), we obtain:

$$R_s = -q \cdot R - R_{Last} + q^2 \cdot R + U_b \cdot q \cdot R_{Last} / U_{Last}(R_s, q).$$

Figure 4:
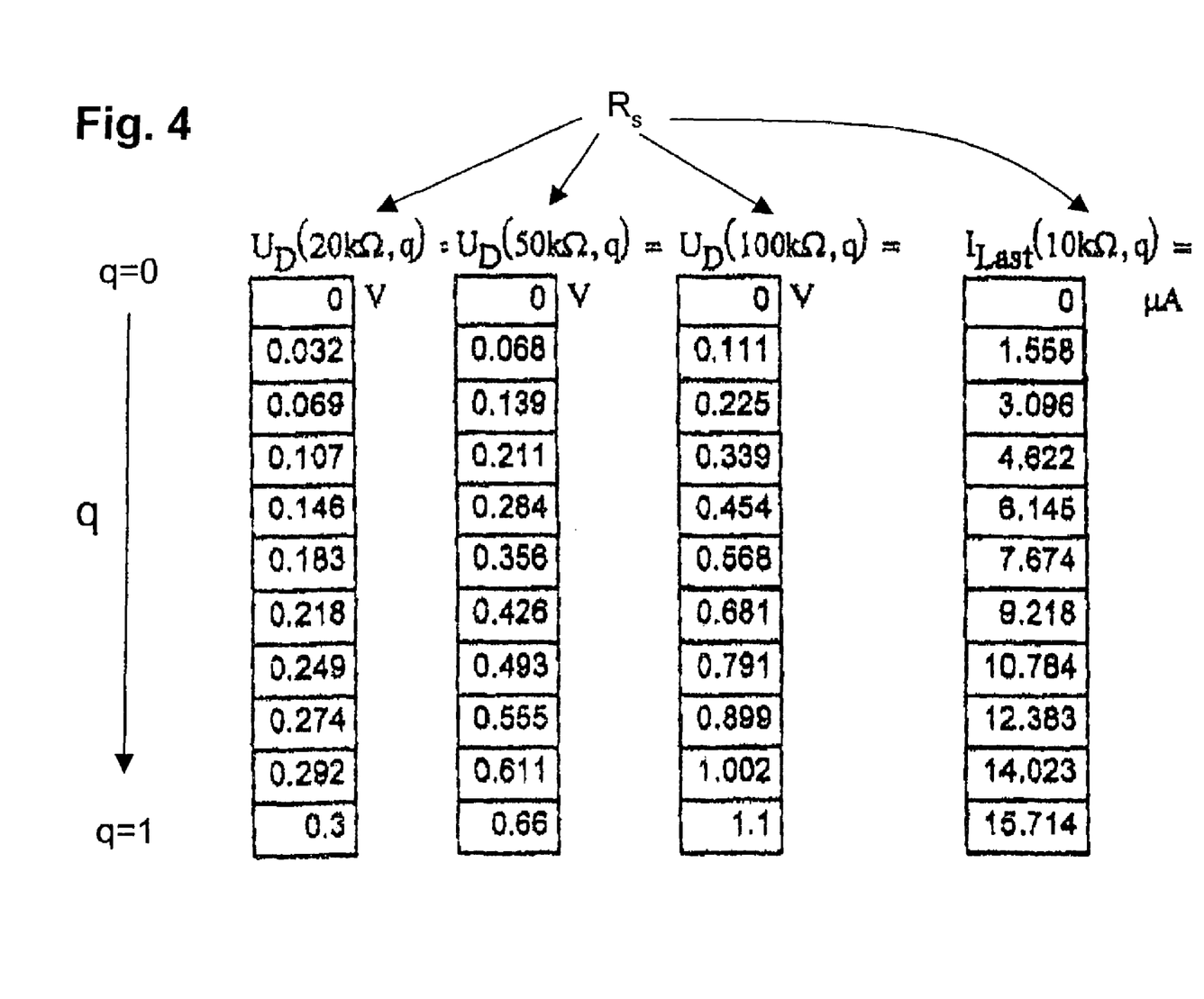
FIG. 4 shows a table with the voltage and current values found at various wiper contact resistance values.

FIG. 4 shows a table with the corresponding voltage and current values at various wiper contact resistances (Rs=20 kΩ, 50 kΩ, 100 kΩ, and various potentiometer positions q (vertical lines).

Figure 5:
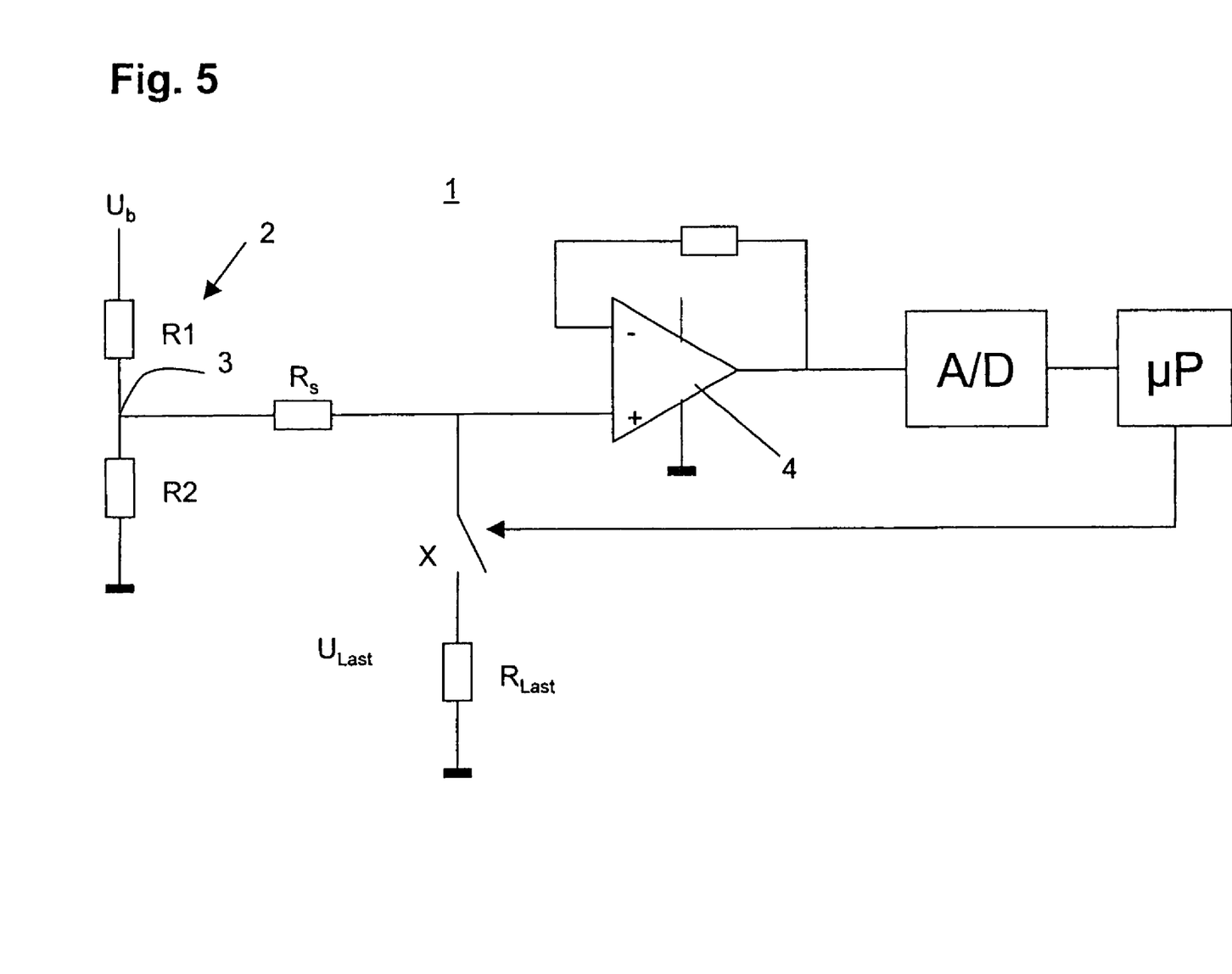
FIG. 5 shows a circuit arrangement with an op-amp circuit for determining the wiper contact resistance.

The analog voltage $U_{Last}$ or $U_2$ is advisably converted by an A/D converter to a digital signal, as shown in FIG. 5. Both voltages will be present at the A/D converter when, for example, at least one op-amp circuit 4 with very high resistance is inserted between the A/D converter and the center tap.

The change in the voltage divider ratio can be calculated, i.e., evaluated, especially by a microprocessor μP on the basis of the voltage difference resulting from the switching-on of the additional load.

In this example, the resistance track of the potentiometer extends between the reference voltage $U_b$ and ground. The center tap is grounded when the intermediate load $R_{Last}$ is added to the circuit. Some other type of arrangement, however, is also possible.

As can be seen FIGS. 2-4, the difference $U_D$ is very small or possibly even zero when the center tap is close to the zero point (q=0).

It is therefore advantageous to use a compensation measure to compensate for the situation in which the center tap 3 is at the zero point or close to the zero point.

One possibility is to reverse the polarity of the potentiometer when the tap is at the zero point or close to the zero point. As a result, for example, q=0 becomes q=1. The microprocessor μP controls this reversal and takes it into account.

An advantageous measure consists in feeding the electrically conducting plastic (the potentiometer track) with two voltages and in connecting the load resistance $R_{Last}$ to a third potential, for which certain voltage conditions must be taken into account. So that a suitable measurement signal can be obtained no matter where the wiper is located, the three voltages U1, U2, and U3 (R1, R2, $R_{Last}$) must satisfy certain conditions, where U1 and U2 supply the track and U3 is present at the load resistor. The voltage U3 is the potential at $R_{Last}$. The case where $U_3$=0 V (ground) is also shown.

The voltages must be set as follows:

U3<U2 or U3>U1 and U1>U2.

If the conditions for the voltage supply cannot be satisfied, the following condition (special case) then applies to U3: U1≧U3≧U2.

If U3 satisfies the supply voltage conditions, two measurements are required. For the second measurement, the polarity of the potentiometer pathway, i.e., the potentiometer track, must be reversed (U1 becomes U2 and U2 becomes U1).

Figure 6:
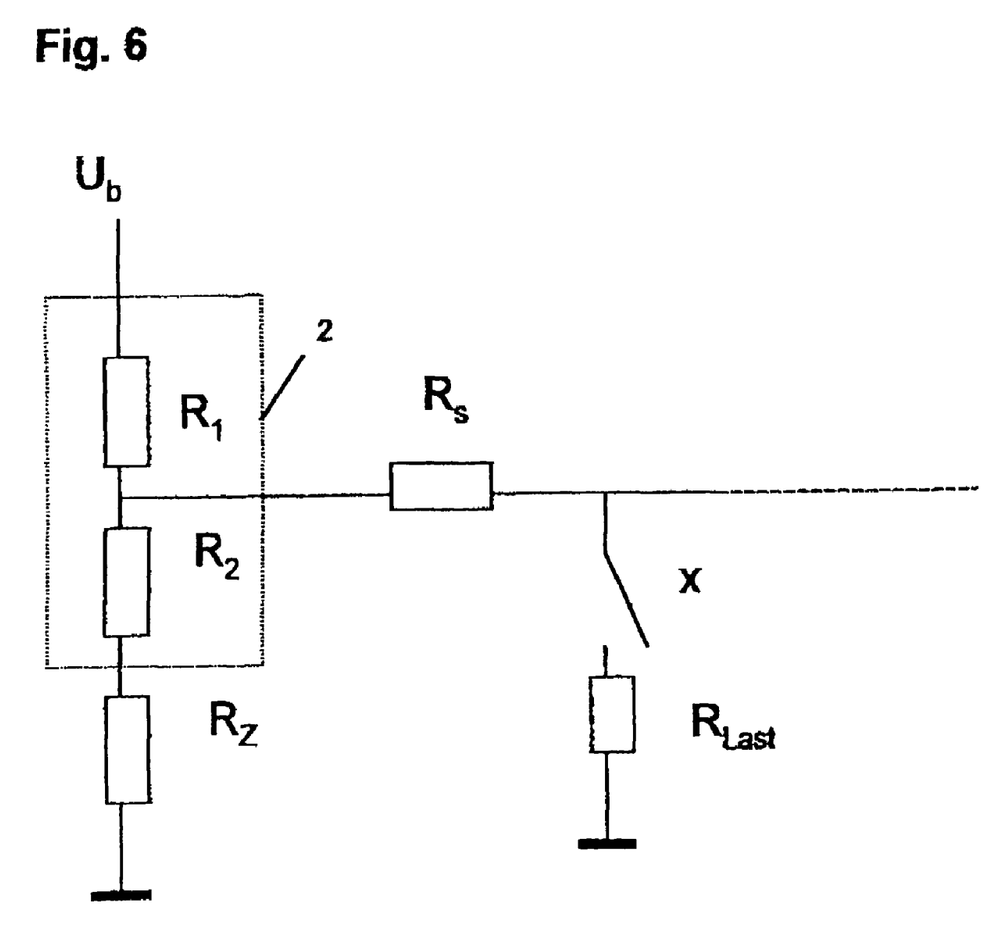
FIG. 6 shows a voltage divider circuit for implementing the inventive method.

As a preferred alternative, an additional resistor $R_z$ can be used between ground and a potentiometer terminal 5 to raise the voltage signal, as FIG. 6 shows. The increase in the voltage signal can be corrected appropriately by the μP (U3<U2).

When this measurement method, i.e., digital signal processing, is used, the method can be carried out without interfering with a drive unit. In the case of an analog control system, the measuring time must be much shorter than the floating time of the drive to ensure that no interference is caused.

The invention is not limited to the examples presented here. Individual features of this specification can be combined with each other.

The invention claimed is:

1. Method for monitoring the contact resistance ($R_s$) of the wiper of a sensor for a variable quantity in an automatic control circuit, with a potentiometer (2), in which the position of the center tap (3) determines the value of the quantity, where the cyclic switching-on of a load ($R_{Last}$) is used to determine the wiper contact resistance ($R_s$) on the basis of the change in the voltage divider ratio, and where the change in the voltage divider ratio is evaluated by a microprocessor (μP) on the basis of the voltage difference caused by the switching-on of the load, characterized in that the microprocessor (μP)

supplies a corrected value of the potentiometer's position and makes this corrected value available to the control circuit.

2. Method according to claim 1, characterized in that the load ($R_{Last}$) is an ohmic load, especially a load resistance component.

3. Method according to claim 2, characterized in that a switch element (X) is located between the load ($R_{Last}$) and the center tap (3) or is parallel to them.

4. Method according to claim 2, characterized in that the potentiometer (2) is connected between a reference voltage ($U_b$) and ground, and in that load ($R_{Last}$) is connected to the center tap (3) and to ground.

5. Method according to claim 2, characterized in that a compensation measure is used to compensate for the situation in which the center tap (3) is at the zero point or close to the zero point, i.e., the point at which there would be no voltage difference or at least only a very small difference when the extra load is switched on.

6. Method according to claim 1 or, characterized in that a switch element (X) is located between the load ($R_{Last}$) and the center tap (3) or is parallel to them.

7. Method according to claim 6, characterized in that an analog voltage at the center tap (3) is converted by an A/D converter to a digital signal.

8. Method according to claim 6, characterized in that a compensation measure is used to compensate for the situation in which the center tap (3) is at the zero point or close to the zero point, i.e., the point at which there would be no voltage difference or at least only a very small difference when the extra load is switched on.

9. Method according to claim 1, characterized in that an analog voltage at the center tap (3) is converted by an A/D converter to a digital signal.

10. Method according to claim 9, characterized in that at least one op-amp circuit (4) is present between the A/D converter and the center tap (3).

11. Method according to claim 9, characterized in that a compensation measure is used to compensate for the situation in which the center tap (3) is at the zero point or close to the zero point, i.e., the point at which there would be no voltage difference or at least only a very small difference when the extra load is switched on.

12. Method according to claim 1, characterized in that the potentiometer (2) is connected between a reference voltage ($U_b$) and ground, and in that load ($R_{Last}$) is connected to the center tap (3) and to ground.

13. Method according to claim 1, characterized in that a compensation measure is used to compensate for the situation in which the center tap (3) is at the zero point or close to the zero point, i.e., the point at which there would be no voltage difference or at least only a very small difference when the extra load is switched on.

14. Method according to claim 13, characterized in that the polarity of the potentiometer (2) is reversed when the center tap is at or near the zero point.

15. Method according to claim 13, characterized in that the potentiometer (2) is connected between a first voltage potential and a second voltage potential, and in that the load ($R_{Last}$) is connected to a third potential, where the third voltage potential (U3) is less than the second potential (U2) and the first potential (U1), and where the first voltage potential (U1) is greater than the second voltage potential (U2).

16. Method according to claim 13, characterized in that an additional resistor ($R_z$) is used between ground and a potentiometer terminal (5) to raise the voltage signal.

17. Method for monitoring the contact resistance ($R_3$) of a potentiometer wiper, said potentiometer includes first and second terminals, a voltage source interconnected with said first terminal of said potentiometer, said second terminal of said potentiometer interconnected with ground, said wiper of said potentiometer forms a voltage divider, said measured voltage output from said voltage divider being representative of the position of said wiper of said potentiometer, an operational amplifier, said operational amplifier interconnected with said wiper of said potentiometer, an analog to digital converter interposed between said operational amplifier and a microprocessor, a switch, a load resistor, said switch interconnected with said wiper of said potentiometer and with said load resistor, said load resistor includes a first interconnection with said switch and a second interconnection with ground, said wiper of said potentiometer includes contact resistance, comprising the steps of:

operating said switch cyclically interconnecting said load ($R_{Last}$) and said wiper of said potentiometer;

monitoring said voltage across said load resistor when said switch is closed with said operational amplifier, said analog to digital controller, and said microprocessor;

monitoring said voltage across said wiper to ground when said switch is open with said operational amplifier, said analog to digital controller and said microprocessor;

calculating and monitoring using said operational amplifier, said analog to digital converter, and said microprocessor, said wiper contact resistance ($R_3$ based on the change of said voltages from said wiper output of said voltage divider: (1) with said switch open and said load resistor not connected to said wiper, and (2) with said switch closed and said load resistor connected to said wiper;

calculating, using said operational amplifier, said analog to digital converter and said microprocessor, the correct position of said wiper of said potentiometer; and, outputting, using said microprocessor, said correct position of said wiper of said potentiometer to a control circuit.

18. Method according to claim 17, characterized in that a compensation measure is used to compensate for the situation in which the center tap (3) is at the zero point or close to the zero point, i.e., the point at which there would be no voltage difference or at least only a very small difference when the extra load is switched on.

* * * * *

UNITED STATES PATENT AND TRADEMARK OFFICE
CERTIFICATE OF CORRECTION

PATENT NO. : 7,535,333 B2 Page 1 of 1
APPLICATION NO. : 11/185268
DATED : May 19, 2009
INVENTOR(S) : Stefan Flentge and Fausto Crespo Vidal It is certified that error appears in the above-identified patent and that said Letters Patent is hereby corrected as shown below:

Col. 6, line 2, after "the" delete "AID" and insert --A/D--.

Col. 2, lines 28, 32, and 35 cancel the paragraphs beginning with "The invention is therefore ...", "This task is accomplished ...", and "The subclaims present ...".

Col. 6, line 57, insert the following text:

--List of Reference Symbols

| | |
|---|---|
| 1 | circuit arrangement |
| 2 | potentiometer |
| 3 | center tap |
| 4 | op-amp circuit |
| 5 | potentiometer terminal |
| A/D | analog-digital converter |
| μP | microprocessor |
| X | switch element |
| $U_b$ | reference voltage |
| $R_s$ | wiper resistance--. |

Signed and Sealed this

Twenty-third Day of June, 2009

JOHN DOLL
*Acting Director of the United States Patent and Trademark Office*